United States Patent
Lubitz et al.

(10) Patent No.: US 7,015,629 B2
(45) Date of Patent: Mar. 21, 2006

(54) ADDITIONAL CONTACTING FOR AN ELECTRICAL COMPONENT AND PIEZOELECTRIC COMPONENT IN THE FORM OF A MULTILAYER STRUCTURE

(75) Inventors: Karl Lubitz, Ottobrunn (DE); Carsten Schuh, Baldham (DE); Thorsten Steinkopff, Eglharting (DE); Andreas Wolff, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/696,690

(22) Filed: Oct. 29, 2003

(65) Prior Publication Data

US 2004/0108792 A1 Jun. 10, 2004

Related U.S. Application Data

(63) Continuation of application No. PCT/DE02/01545, filed on Apr. 26, 2002.

(30) Foreign Application Priority Data

Apr. 30, 2001 (DE) .................................. 101 21 272

(51) Int. Cl.
*H01L 41/04* (2006.01)
(52) U.S. Cl. ...................................... 310/366; 439/110
(58) Field of Classification Search ................ 310/366; 439/110
See application file for complete search history.

(56) References Cited

U.S. PATENT DOCUMENTS

| | | | |
|---|---|---|---|
| 4,499,566 A * | 2/1985 | Abbott | 367/165 |
| 4,581,556 A * | 4/1986 | Yamamoto | 310/320 |
| 4,849,719 A * | 7/1989 | Belek et al. | 359/245 |
| 5,038,249 A * | 8/1991 | Rounds | 361/311 |
| 5,055,734 A * | 10/1991 | Grawey et al. | 310/366 |
| 5,059,857 A * | 10/1991 | Brandt et al. | 310/366 |
| 5,087,848 A * | 2/1992 | Kelley et al. | 310/328 |
| 6,104,129 A * | 8/2000 | Okamoto | 310/366 |
| 6,528,927 B1 * | 3/2003 | Schuh et al. | 310/328 |
| 2003/0168945 A1 * | 9/2003 | Birgel | 310/366 |

FOREIGN PATENT DOCUMENTS

| | | |
|---|---|---|
| DE | 196 46 676 C1 | 4/1998 |
| DE | 196 48 545 A1 | 5/1998 |

(Continued)

Primary Examiner—Thomas M. Dougherty
(74) Attorney, Agent, or Firm—Baker Botts L.L.P.

(57) ABSTRACT

An additional contacting (30) for a piezoelectric component (10) is formed as a multilayer structure, wherein the piezoelectric component (10) is formed by a stack (16) of alternatingly arranged piezoelectric ceramic layers (11) and electrode layers (12, 13). The additional contacting (30) has a series of connecting elements (31) for connecting a metallization (15) of the electric component (10) to an electrical connecting element (19). In order to minimize mechanical loads during dynamic operation of the piezoelectric component (10), the additional contacting (30) is configured as an individual, structured component (32), especially in the form of a structured foil. Said structured foil (32) advantageously has a current conduction path (33) which is common to the connecting elements (31) and a contacting zone formed in the area of static base plate (17), wherein the additional contacting (30) is connected to the electrical connecting element in the area of said contacting zone.

8 Claims, 3 Drawing Sheets

FOREIGN PATENT DOCUMENTS

| | | |
|---|---|---|
| DE | 197 15 488 C1 | 6/1998 |
| DE | 19715488 * | 6/1998 |
| DE | 198 18 068 A1 | 10/1999 |
| DE | 199 17 728 A1 | 10/2000 |
| DE | 199 28 189 A1 | 4/2001 |
| JP | 03-270500 * | 12/1991 |
| WO | WO-00/05771 A1 * | 7/1999 |
| WO | WO 00/57497 | 9/2000 |
| WO | WO-0057497 * | 9/2000 |
| WO | WO 00/63980 | 10/2000 |
| WO | WO 000/79607 | 12/2000 |

* cited by examiner

ADDITIONAL CONTACTING FOR AN ELECTRICAL COMPONENT AND PIEZOELECTRIC COMPONENT IN THE FORM OF A MULTILAYER STRUCTURE

CROSS REFERENCE TO RELATED APPLICATION

This application is a continuation of copending International Application No. PCT/DE02/01545 filed Apr. 26, 2002 which designates the United States, and claims priority to German application no. 101 21 272.0 filed Apr. 30, 2001.

TECHNICAL FIELD OF THE INVENTION

The present invention initially relates to additional contacting for an electrical component, especially for a piezoelectric component in the form of a multilayer structure. Furthermore the invention relates to a piezoelectric component in the form of a multilayer structure.

BACKGROUND OF THE INVENTION

Piezoelectric components can be embodied as multilayer components from a stack of alternatingly arranged piezoelectric ceramic layers and electrode layers and are becoming ever more important in modern electrical engineering. For example piezoelectric components in the form of piezo actors are used as control drives in conjunction with valves and similar devices.

A known piezo actor is for example described in DE 196 46 676 C1. These types of piezo ceramics utilize the effect in which they are charged up under a mechanical pressure or tension and on the other hand expand when an electrical voltage is applied along the main axis of the ceramic layer. To multiply the usable length extension monolithic multilayer actors are used for example which consist of a sintered stack of thin foils of piezo ceramic (for example lead zirconium titanate) with interleaved metallic electrode layers. The electrode layers are brought out of the stack alternately and connected piezoelectrically in parallel via external metalization. For this purpose, through metalization in the form of a strip or band is applied to the two contact sides of the stack which is connected to all electrode layers of the same polarity. Additional contacting which is still executed in many forms is still frequently applied between the metalization and the electrical access elements of the piezoelectric component. If an electrical voltage is applied to the electrical access elements, the piezo foils expand in the field direction. By mechanical series connection of the individual piezo foils the nominal expansion of the entire stack is already reached at relatively low electrical voltages.

These types of actors are subjected to a considerable stress by the mechanical lifting. Of decisive significance for the lifetime of these types of actors in dynamic operation, to achieve higher numbers of cycles and higher reliability, is electrical external contacting. Current deigns of multilayer actors contain up to several hundred electrode layers which are generated for example by screen printing of a silver palladium paste and subsequent co-firing with the ceramic layers. These electrode layers must be connected reliably and permanently with the external electrical connection elements. Since continuity metalization can also be interrupted in dynamic operation at individual points, for example by tears or similar occurring, additional contacting or the connection of the metalization with the outgoing electrical connection elements must be made via a larger number of parallel connection elements, which can take the form of thin conductor tracks, wires or such like.

Such additional contacting is for example also disclosed in the older Patent Application DE 198 18 068 also submitted by the applicant. In this the electrode layers of one polarity of a piezoelectric actor are initially connected to each other via continuity metalization. To connect the metalization to electrical connections a series of connecting elements are provided.

SUMMARY OF THE INVENTION

The lifetime and reliability of such a piezoelectric component in dynamic operation is decisively dependent on the quality of the additional contacting. For example material fatigue can occur in the connecting elements, such as the conductor tracks, wires or such like. Furthermore such material fatigue can also occur in the connecting areas of the connecting elements to the metalization or to the electrical access elements. The level of the cyclic mechanical loads leading to fatigue is determined, with the given choice of material, by the lift of the piezoelectric multilayer component relative to the static connecting element as well as by possible longitudinal or transversal resonances of the electrical connection elements which typically involves contact pins. These longitudinal or transverse oscillations arising in dynamic operation cause additional mechanical stresses in the area of the additional contacting. Using the prior art as its starting point, the object of the present invention is to further develop additional contacting for an electrical component as well as a piezoelectric component in the form of a multilayer structure of the type described at the start in such as way as to avoid the disadvantages of the prior art. In particular reliable additional contacting for an electrical component or an appropriately improved piezoelectric component in the form of a multilayer structure are to be specified.

This object can be achieved by an additional contacting for an electrical component, especially for a piezoelectric component in the form of a multilayer structure, comprising more than one connecting element for connecting the electrical component with an electrical connection element, wherein the additional contacting is embodied as a single, structured component.

The additional contacting can be embodied as a single, structured foil. Each connecting element can be connected to a single, shared current conductor track. The current conductor track may have a greater width compared to each connecting element. The width of the current conductor track may change over the length of the current conductor track. The structured component may feature a contacting zone in which an electrical access element can be located. The additional contacting can be formed in at least some areas from a material with higher electrical conductivity. The additional contacting can be formed from at least one material from the group Cu, Cu alloy, Fe, steel, Ni basic alloy, Co basic alloy. The additional contacting can be surrounded in at least some areas by a passivation material.

The object can also be achieved by a multilayer construction piezoelectric component in which a piezoelectric ceramic layer and an electrode layer are always arranged alternately one above the other to form a stack, in which at least one first electrode layer and at least one second electrode layer following on from it in the stack adjacent to the first electrode layer are each connected for electrical contacting in alternating polarity with at least one metalization located to the side of the stack with each metalization being connected via an additional contacting with more than one connecting element connected electrically to an access element, wherein the additional contacting is embodied as a single, structured component.

The stack can be located on a base plate, preferably on a static base plate. The base plate may feature at least one through-hole for the access element. The additional contacting can be embodied as a single structured foil that each connecting element is connected to a single shared current conductor track and that the current conductor track in relation to each connecting element is embodied on the side of the additional contacting away from the stack. Each connecting element on the side of the additional contacting away from the stack can be connected with the at least one metalization. The current conductor track can be aligned in parallel to the lengthwise alignment of the stack. The stack can be located on a base plate, preferably on a static base plate, the base plate features at least one through-hole for the access element, and the width of the current conductor track seen from the free end of the stack increases in the direction of the base plate. The additional contacting may feature a contacting zone, that the contacting zone is located in the area of the base plate and that the access element is connected with the contacting zone. The additional contacting can be at least in some areas surrounded by a passivation material and the stack and the additional contacting can be preferably located in an individual enclosure made from passivation material. The contacting zone of the additional contacting in its initial state, seen from the free end of the stack extends beyond the stack and that the access element can be located on the back of the contacting zone. The piezoelectric can be embodied as a piezoelectric actor or piezoelectric converter.

Features and details which are described in accordance with the inventive additional contacting naturally also apply in this case to the piezoelectric component, and vice versa.

In accordance with the first aspect of the invention additional contacting for an electrical component, especially for a piezoelectric component in the form of a multilayer structure is provided which features more than one connecting element, that is a number of connecting elements for connecting the electrical component to a electrical access element in each case. The additional contacting is characterized in accordance with the invention in that it is designed as a single structured component.

The embodiment in accordance with the invention allows reliable additional contacting to be realized which, built into electrical components, leads to electrical components with high durability and long life. In accordance with the invention additional contacting is provided which lowers the mechanical stresses in the area of the connecting elements and also reduces possible resonances of the electrical access elements and the associated mechanical stresses. This is able to be achieved in that the entire additional contacting is now designed as just one component. By comparison the additional contacting known from the prior art consisted in each case of a whole number of individual elements, that is the corresponding connecting elements. Each of these connecting elements involved a component which was independent of the other connecting elements in each case. With the embodiment of the additional contacting in accordance with the invention, materials can now be used which make more secure and cost effective fabrication processes possible, with a simultaneous increase in reliability. Examples of suitable materials are explained in more detail in the course of the description.

The additional contacting in accordance with the invention can be manufactured at low cost and leads to increased reliability of an electrical component equipped with the additional contacting, for example of a piezoelectric component in the form of a multilayer structure, in dynamic operation. Advantageously the additional contacting can be designed as a single structured foil. These types of foils can be manufactured in an especially simple and thereby low-cost way.

Advantageously the additional contacting can be designed in such as way that each connecting element is connected to a single common current conductor track. Since the additional contacting is now designed as a single structured component both the connecting elements and the shared current conductor track form integral parts of the structured component, which increases the reliability of the additional contacting. Thus for example it is no longer necessary to connect the individual connecting elements via the corresponding connections, for example a solder connection, a welded connection or similar with an access element. The connection of the additional contacting is now undertaken via a single connection between the current conductor track and an access element. This connection is advantageously implemented in an area of the current conductor track that is especially suitable as regards stress, as is explained in more detail in the course of the description.

Whereas in the prior art all connecting elements were each connected individually with the electrical connection elements, which as a rule involved a contact pin or such like, the connecting elements are now connected in one piece with the current conductor track. The particular embodiment of the current conductor track, for example in the form of a foil, means that, in comparison to the through contact pins of the conventional solutions previously used, it exhibits significantly lower mass assignment, whereby the self-resonances occurring with the known solutions in the contact pins can now be reduced.

The invention is not restricted to a specific structuring of the additional contacting. Instead the length and width of the connecting elements, with width and shape of the spaces between two adjacent connecting elements, the design of the transition areas between connecting elements and metalization or the current conductor track and such like can be specifically designed to suit the requirements and area of application of the electrical component.

In a further embodiment the current conductor track can feature a greater width in comparison to each connecting element. In this way the desired current density in the current conductor track can be explicitly set. Advantageously the current conductor track can feature a width which changes over the length of the current conductor track. In this way a constant current density can be achieved over the entire length of the current conductor track. Advantageously the structured component can feature a contacting zone in which an electrical access element can be arranged. In this case the electrical access element can typically, but not exclusively, be connected to the contacting zone by means of soldering, welding or such like. The contacting zone is preferably embodied in the structured component in such a way that the connection between metalization and electrical access element leads to the lowest possible mechanical stresses. A number of examples of where and how such a connection between access element and contacting zone can be implemented are described below in conjunction with the piezoelectric component in accordance with the invention.

In a further embodiment at least areas of the additional contacting can be formed from a material with higher electrical conductivity. By greatly reducing the mechanical stresses in the area of the additional contacting by embodying it accordance with the invention, materials can now be used for the additional contacting, for example the structured foil, which are more susceptible to mechanical stress but still possess sufficient electrical conductivity for the current conductor track and can be produced at significantly lower cost. In particular the additional contacting in accordance with the invention can now be produced by a simple-to-realize method, such as for example punching, lithographic methods or similar. When suitable materials are selected for the additional contacting it is for example furthermore possible to connect the connecting elements to the metalization by laser soldering or similar.

The invention is not restricted to specific materials for additional contacting. Advantageously however the materials feature a softening temperature of the material of >150° C. since many areas of application for piezoelectric components lie within this range of temperatures. Furthermore advantageously those materials which are used are those that can be combined well with other materials by soft soldering or similar for example. Advantageously the additional contacting can be formed from at least one material from the group Cu, Cu alloys, Fe, steel, Ni basic alloys, Co basic alloys. Of course other materials are also conceivable The only important thing is that the materials used have a sufficient dielectric strength, for example in the area of the current conductor track.

Advantageously the additional contacting can be made of steel. Stainless steels are particularly suitable here which as a result of their overall potential have very good properties as regards very high fatigue strength, softening temperatures far in excess of 200° C., standard availability in the form of the thinnest foils and lower product costs. Examples of suitable steels for use are X12 NiCr 72 13, X10 CrNiTi 18 9, X40 CrMoV 20 5, X5 CrNi 18 9, X10 CrNi 18 8 and similar.

Examples of suitable CU alloy-based materials are CuSn6, CuNi3Si1Mg, CuZn23A13, CuCo2Be, CuNi2Be, CuBe2 and similar. Examples of Ni basic alloys that can be used are the NiCo alloys Duratherm 600 and Nivaflex 45/5, but also NiBe2 and similar. Vacon CF8 is especially suitable as a Co basic alloy.

The additional contacting can advantageously be surrounded, at least in some areas, by a passivation material. A passivation material involves a type of protective material and/or insulation material which can be formed from plastic for example. An electrical passivation of exposed electrical components, such as for example electrical connecting elements, electrical connecting lines, the electrode layers to be found in a piezoelectric component and such like is required to avoid electrical arcing and short circuits between adjacent, exposed electrical components.

In accordance with the second aspect of the invention a piezoelectric component in the form of a multilayer structure is provided in which an alternating piezoelectric ceramic layer and an electrode layer arranged one above the other to form a stack, with which at least a first electrode layer and at least one second electrode layer following the first layer in the stack and adjacent to it for electrical additional contacting in alternating polarity are each connected to at least one metalization arranged at the side of the stack, with each metalization being connected electrically via an additional contacting with more than one connecting element to an access element. The piezoelectric component is characterized in accordance with the invention in that the additional contacting is embodied in the form of additional contacting as previously described in accordance with the invention.

In this way piezoelectric components with a reliable additional contacting are created which enables the mechanical stresses to be lowered in the area of the additional contacting as well as possible resonances in the electrical connection elements and the associated mechanical stresses to be reduced.

Preferably the stack of layers, comprising piezoelectric ceramic layers and electrode layers, can be positioned on a base plate, preferably on a static base plate. This base plate can advantageously feature at least one through-hole for the access element.

Advantageously the additional contacting can be designed as a single structured foil in which case each connecting element is connected to a single common current conductor track. Preferably the current conductor track is embodied on the side of the additional contacting facing away from the stack in relation to each connecting elements. In this case each connecting element on the side of the additional contacting facing away from the stack can be connected with the at least one metalization. The embodiment of the additional contacting in accordance with the invention produces an integral connection between the connecting elements and current conductor track so that a separate connection, for example via a soldered connection, a welded connection or similar, need only be implemented between the connecting elements and the metalization.

Advantageously the current conductor track can be aligned in parallel to the longitudinal alignment of the stack.

Advantageously in this case the width of the current conductor track can increase, seen from the free end of the stack, in the direction of the base plate.

In a further embodiment the additional contacting can feature a contacting zone, with the contacting zone arranged in the area of the base plate and with the access element being connected to the contacting zone in this area. This embodiment has a number of advantages. The connection of the additional contacting embodied as a single, structured component and the access element, for example a contact pin, in the area of the dynamic base plate, lies in the area of the static base plate for example and of the stack plate which is also static in dynamic operation. This means that this connection remains mechanically unstressed.

Preferably at least areas of the additional contacting can be surrounded by a passivation material, with the stack and the additional contacting preferably being arranged in a single enclosure made of passivation material.

In this case the structured component of the additional contacting, for example the structured foil and here especially the current conductor track are preferably in the vicinity, meaning the immediate environment, of the stack are encapsulated by the passivation material, for example a suitable plastic. This means that the current conductor track is homogeneously extended in dynamic operation along with the stack of the piezoelectric multilayer component which greatly reduces the mechanical stresses on the connection points between the connecting elements and metalization as well as on the connecting elements themselves.

This follower effect in dynamic operation is guaranteed in particular by the fact that the gap between the current conductor track and the stack is intentionally kept as small as possible.

In a further embodiment the contacting zone of the additional contacting in its initial state, seen from the free end of the stack, can extend beyond the stack, with the access element initially being located on the back of the contacting zone. Subsequently the additional contacting in the area of the contacting zone will be bent round, for example through 180°, so that the contact pin is now embodied on the front of the contacting zone. Subsequently the access element can be fixed, for example be extending through the hole in the base plate for example.

In this way the choice and execution of the connecting processes between the connecting elements and the metalization or the access element can be further simplified.

As already presented in detail above a suitable power feed to the stack via the connecting elements is a requirement for being able to rectify the adverse influence of individual polarizing tears in the area of stack contacting, which for example can give rise to a hole through the metallization and thus local non-homogeneous deflections. The additional contacting design in accordance with the invention, especially the connection of the additional contacting to outgoing access elements in the static, non-deflecting area of the piezoelectric component, can reduce the mechanical stresses in the additional contacting designed as a single structured component to the extent that a material which has lower resistance to mechanical stress but has sufficient electrical conductivity can be used.

Advantageously a piezoelectric component in accordance with the invention as described here can be designed as a piezoelectric actor or piezoelectric converter. Typical embodiments of this are stack actors, bending actors, converters for medical ultrasound and similar. In particular the piezoelectric component can be used as a piezo actor in vehicle fuel injection systems, for example in diesel injection systems.

BRIEF DESCRIPTION OF THE DRAWINGS

The invention will now be explained in more detail using exemplary embodiments which refer to the drawings in the document. The diagrams show.

DETAILED DESCRIPTION OF THE PREFERRED EMBODIMENTS

Figure 1:
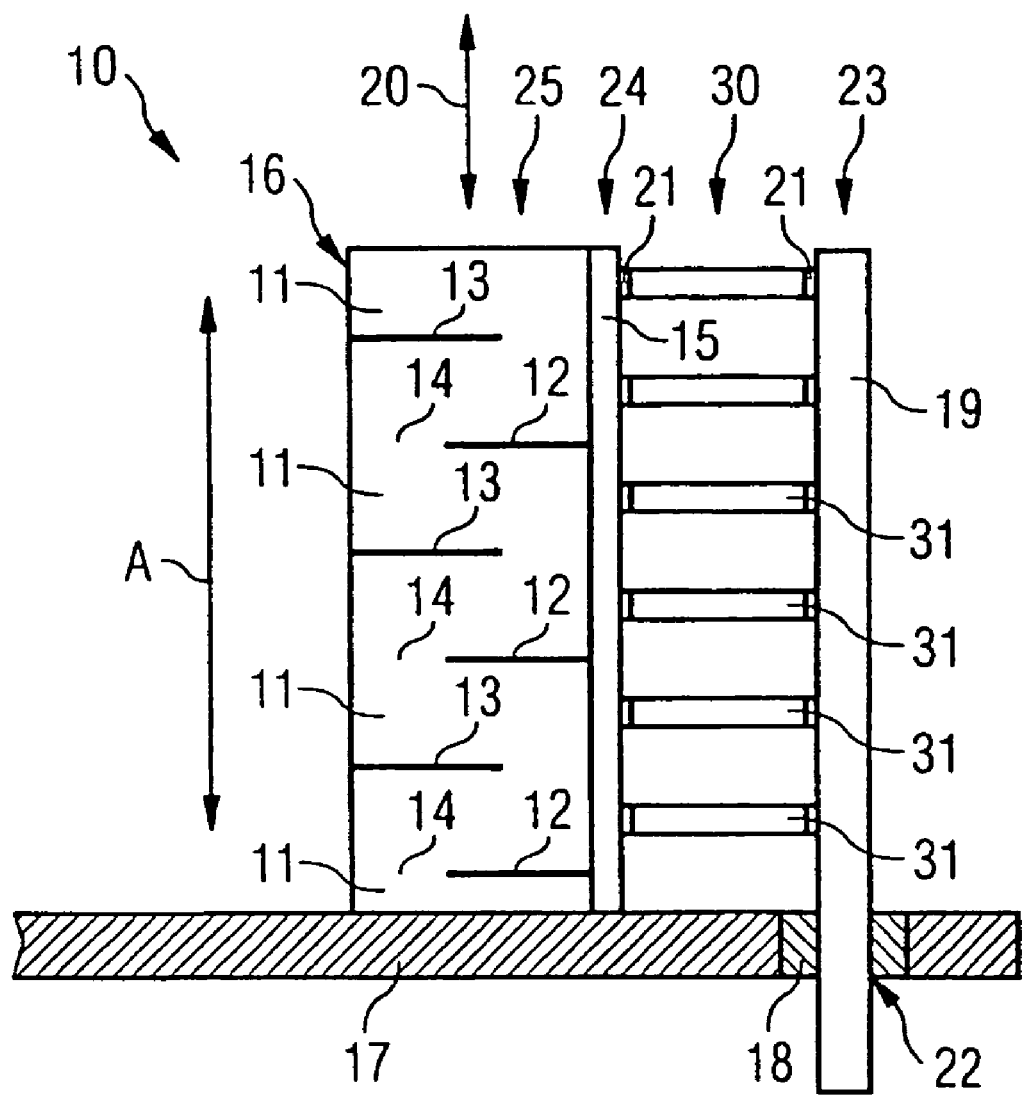
FIG. 1 a schematic side view of a piezo electric component known from the prior art.

FIG. 1 first shows a multilayer design piezoelectric component 10 known from the prior art which in this case is a piezo actor. The piezo actor 10 consists of a stack 16, in which a piezoelectric ceramic layer 11 and an electrode layer 12, 13 are always arranged alternately one above the other. In each case at least one first electrode layer 12 and at least one second adjacent electrode layer 13 in stack 16 following the first electrode layer 12 are connected to the electrical contacting zone in alternating polarity, each with at least one metalization 15 located at the side of stack 16. Metalization 15 is a through band with which all electrode layers 12 or 13 respectively are connected to one and the same polarity. The exemplary embodiment according to FIG. 1 shows only one metalization 15 via which all electrode layers 12 are connected.

Metalizations 15 are located in the area of stack 16 in which the latter features inactive insulation zones 14 in each case.

Stack 16 is located on a static base plate 17 which features a through-hole 22 clad with electric insulation means 18 to bring through an electrical connection element 19. Electrical access element 19 has the task of applying an electrical current to stack 16, that is to the electrode layers 12 or 13 respectively. To this end electrical access element 19 is connected via an additional contacting 30 with metallization 15. With the piezoelectric actor 10 known from the prior art, as shown in FIG. 1, the additional contacting 30 consists of a number of independent connection elements 31 which typically take the form of thin wires. The individual connecting elements 31 are connected via suitable connections 21, for example soldered connections, welded connections or similar, with the electrical connection elements 19 or the metallization 15 respectively. The connecting elements 31 are connected to the metallization 15 in this case on the side of the connecting elements 31 adjacent to the stack 16, while the connection with the access element 19 is made on the side 23 of connecting elements 31 away from the stack. The connecting elements 31, or the electrical access element 19 respectively are as a rule encapsulated with the actor stack 16 in a plastic housing.

In dynamic operation of piezo actor 10 the base plate 17, the electrical access element 19 and the base of stack 16 remain at rest, whereas the lift occurs at the free end 25 of the stack 16 identified by the double arrow 20. Stack 16 and thereby piezo actor 10 thus execute a lengthwise movement in the direction of the longitudinal alignment A of stack 16. In the area of the free end 25 of stack 16 connecting elements 31 are thus subjected to the maximum mechanical load which restricts the choice of material and imposes increased requirements on the connecting system between the connecting elements 31 and metallization 15 or electrical connection elements 19 respectively. In addition, electrical access element 19 and connecting elements 31 can be stimulated into longitudinal or transversal oscillations which causes additional mechanical loads in the area of the additional contacting 30.

Figure 2:
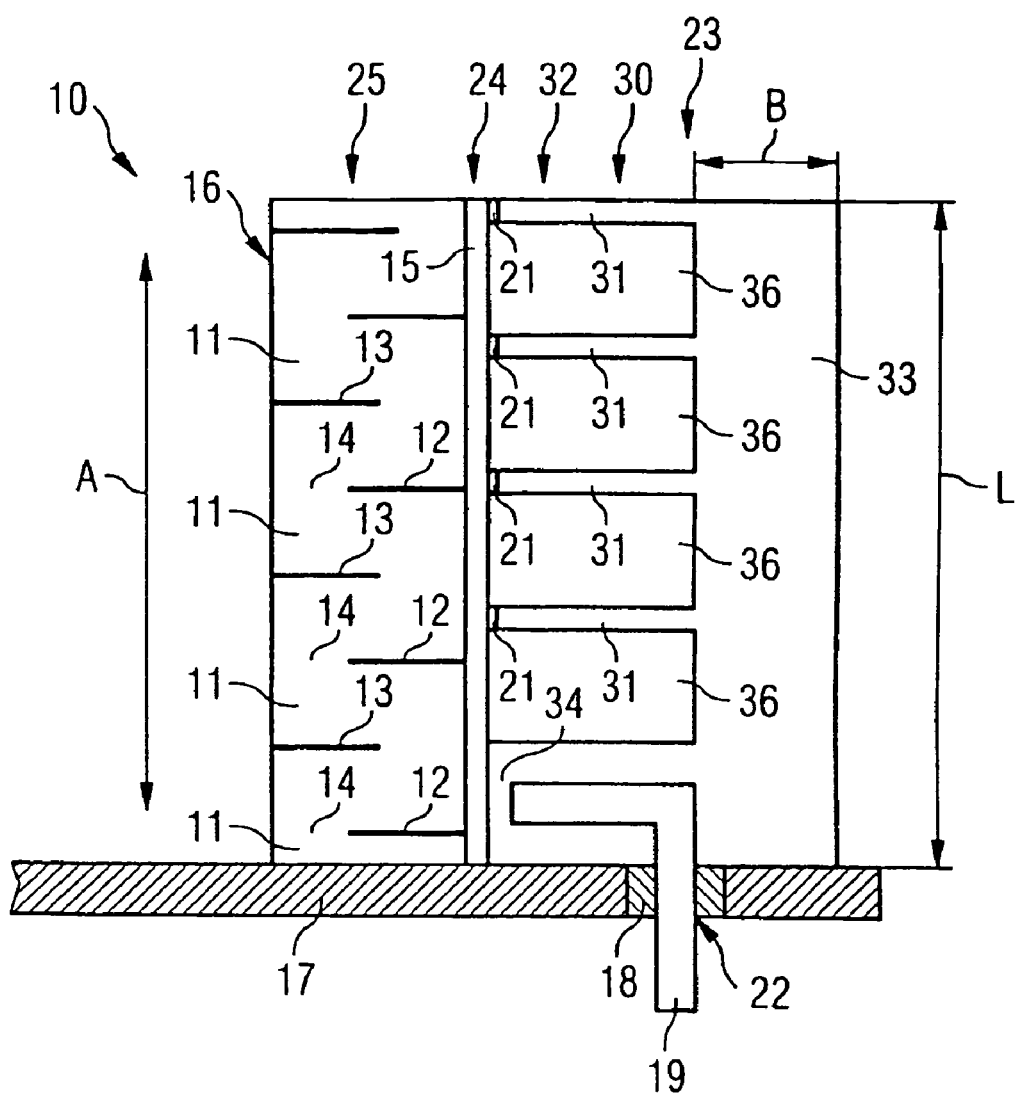
FIG. 2 a side view of a first embodiment of a piezoelectric component in accordance with the invention.

FIG. 2 shows an exemplary embodiment for a solution in accordance with the invention with which these damaging mechanical stresses can be reliably reduced. In this case the basic structure of piezoelectric actor 10 corresponds to the piezoelectric actor shown in FIG. 1 so that identical components are provided with identical reference numbers and to avoid repetition the description of these components is not repeated and reference is made to those shown in FIG. 1.

By contrast to the embodiment shown in FIG. 1, the piezoelectric actor 10 according to FIG. 2 now has additional contacting 30 which no longer consists (as in FIG. 1) of a whole number of self-contained, separate connecting elements 31. Instead the additional contacting is now designed as a single, structured component 32, in the exemplary embodiment shown here as a structured metal foil 32. The metal foil 32 can preferably be manufactured from copper or copper alloys. The structured foil 32 still has a number of connecting elements 31 but these are connected in one piece to a current conductor track 33. This means that the metal foil 32 has a type of "comb structure" with which the individual connecting elements 31 form the "comb teeth" and branch off current conductor track 33. There is provision for spaces 36 between individual, neighboring connecting elements 31.

Current conductor track 33 and connecting elements 31 thus form an integral component, so that the corresponding connections 21 between the connecting elements 31 and current conductor track 33 can now be dispensed with. Additional contacting 30 now only has to be connected to metalization 15 on the side 24 facing stack 16, a connection which in its turn can be made with suitable solder or welded connections 21. On the side 24 of the connecting elements 31 facing away from stack 16 a current conductor track 33 is now provided, which advantageously has a greater width B in comparison with the connecting elements 31.

The additional contacting 30 or the current conductor track 33 respectively can be arranged in respect of stack 16 in such a way that the former, in its lengthwise direction L is aligned in parallel to the lengthwise alignment A of stack 16.

Furthermore the additional contacting 30 features a contacting zone 34 in which an electrical access element 19 is connected to the additional contacting 30. The electrical access element 19 can be routed through the base plate 17 in the way described in FIG. 1.

Figure 3:
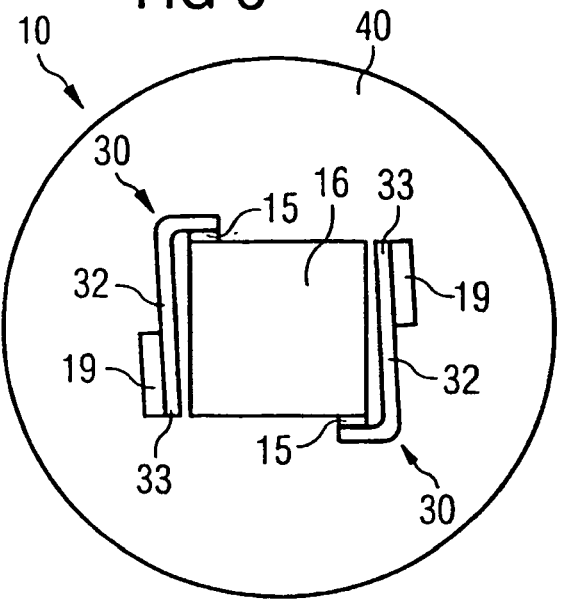
FIG. 3 a view from above of a further embodiment of a piezoelectric component in accordance with the invention.

The embodiment of the additional contacting 30 in accordance with the invention results in a series of advantages. First the connection of the additional contacting 30, which means the structured foil 32, with the electrical connection element 19 lies in the area of the static base plate 17 and the base of stack 16 which is also at rest in dynamic operation, so that this remains under no load when piezoelectric actor 10 is operating. Furthermore structured foil 32 and especially current conductor track 33 are preferably encapsulated in plastic in the vicinity of stack 16. This is also shown in FIG. 3. This means that the current conductor track 33 too is also expanded homogeneously in dynamic operation with stack 16, in which case the mechanical stresses on the connections 21 between the connecting elements 31 and metalization 15 as well as on the connecting elements 31 themselves are greatly reduced. The low mass assignment of current conductor track 33 in comparison to the through electrical connection element 19 of the conventional solution shown in FIG. 1 reduces possible self resonances in conjunction with encapsulation in a passivation material (see FIG. 3).

The marked reduction of mechanical stresses in the area of additional contacting 30 means that materials can be used for structured foil 32, which although mechanically more susceptible to stress, exhibit the good electrical conductivity required for current conductor track 33 and can be produced at significantly lower cost.

FIG. 3 shows a view from above of a piezoelectric actor 10 embedded in a housing 40 made of passivation material. In the exemplary embodiment in accordance with FIG. 3 the gap between the additional contacting 30 and here especially the current conducting track 33 and stack 16 is intentionally kept as small as possible to ensure the follower effect in dynamic operation of piezoelectric actor 10. The choice of passivation material is made in accordance with the form of embodiment and area of application of piezo actor 10. Advantageously the passivation material can be embodied as plastic for example.

Figure 4:
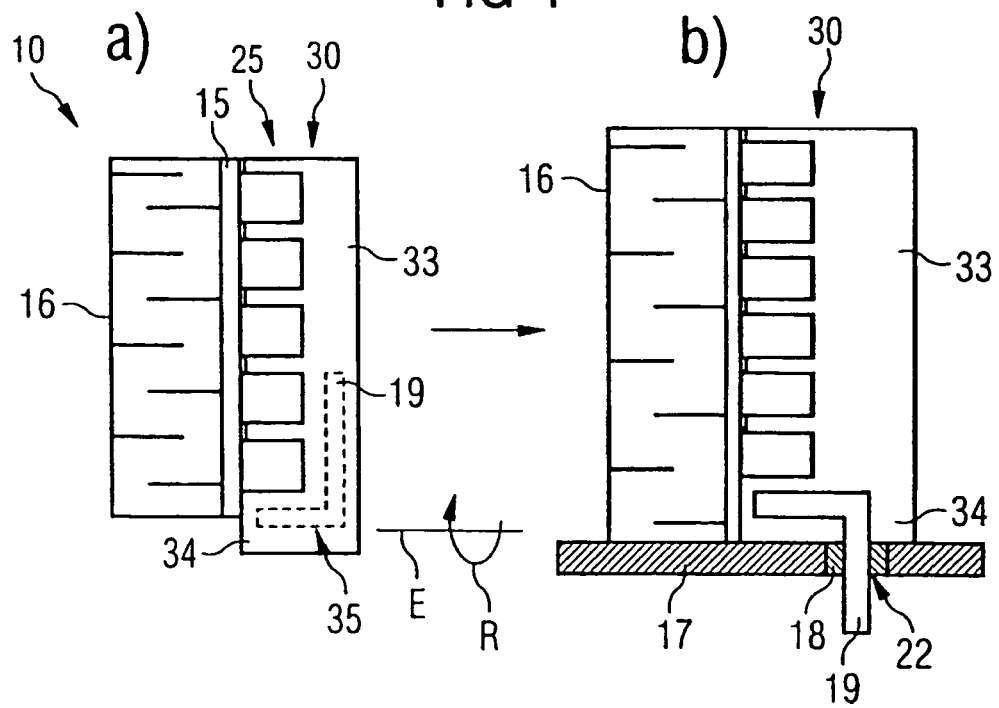
FIG. 4 a side view of a further embodiment of a piezoelectric component in accordance with the invention.

Finally, FIG. 4 shows a further embodiment variant of a piezoelectric actor 10 in accordance with the invention as shown in FIG. 2, so that with regard to the basic structure the reader is referred to the explanations given for FIG. 2.

FIG. 4a shows a structured foil 32 for which the contacting zone 34 in its initial state, viewed from the free end 25 of stack 16, initially extends beyond stack 16 so that a contacting zone 34 extended beyond stack 16 is present. Electrical access element 19 is initially located on the back 35 of the contacting zone 34, which is clearly shown by the dashed lines in the drawing. Subsequently, as shown in FIG. 4b, structured foil 32 is bent through 180° in the area of the contacting zone 35 in direction R to a level E and access element 19 is subsequently fixed into the though-hole 22 of base plate 17. In this way the choice and execution of the connecting processes of additional contacting 30 with metalization 15 and access element 19 can be further simplified.

We claim:

1. An electrical connection system for a piezoelectric component, said system comprising
connecting elements for connecting the piezoelectric component with an electrical connection element and a single conductor track, said connecting elements comprising a single, structured foil component, each connecting element connected to the single, conductor track wherein the single structured foil component includes a contacting zone for contacting the electrical connection element and a static base portion of the piezoelectric component.

2. An electrical connection system according to claim 1, wherein the foil component is formed in at least some areas from a material with higher electrical conductivity.

3. An electrical connection system according to claim 1, wherein the foil component is formed from at least one material selected from the group consisting of Cu, Cu alloy, Fe, steel, Ni alloy, and Co alloy.

4. An electrical connection system according to claim 1, wherein the foil component is surrounded in at least some areas by a passivation material.

5. A contacting system for a piezoelectric component, said system comprising a contacting element comprising connecting elements for connecting the component with an electrical connection element, and a single current conductor track, said connecting elements comprising a single structural component, wherein each connecting element is connected to the single, current conductor track, the single structural component includes a contacting zone for contacting a static base portion of the piezoelectric component.

6. A contacting system according to claim 5, wherein the single structural component is formed in at least some areas from a material with higher electrical conductivity.

7. A contacting system according to claim 5, wherein the single structural component is formed from at least one material selected from the group consisting of Cu, Cu alloy, Fe, steel, Ni alloy, and Co alloy.

8. A contacting system according to claim 5, wherein the single structural component is surrounded in at least some areas by a passivation material.

* * * * *